United States Patent
Park et al.

[19]

[11] Patent Number: 6,084,645
[45] Date of Patent: Jul. 4, 2000

[54] METHOD AND APPARATUS FOR SELECTING A CHANNEL OF A DIGITAL MULTICHANNEL TELEVISION

[75] Inventors: Ju-Ha Park; Pil-Sang Ju, both of Kyungki-do, Rep. of Korea

[73] Assignee: Samsung Electronics Co., Ltd, Suwon, Rep. of Korea

[21] Appl. No.: 09/069,778

[22] Filed: Apr. 30, 1998

[30] Foreign Application Priority Data

Jun. 30, 1997 [KR] Rep. of Korea ................ 97 29838

[51] Int. Cl.[7] ........................................... H04N 5/44
[52] U.S. Cl. .................... 348/734; 348/731; 348/732
[58] Field of Search .......................... 348/734, 725, 348/731, 732, 733; H04N 5/44, 5/50

[56] References Cited

U.S. PATENT DOCUMENTS 5,020,139  5/1991  Keenan .................................. 348/734
5,598,228  1/1997  Saitoh .................................. 348/732

*Primary Examiner*—Sherrie Hsia
*Attorney, Agent, or Firm*—Stass & Halsey LLP

[57] ABSTRACT

A method and apparatus for selecting a program of a digital multichannel television. The method includes the steps of checking whether numeral keys for designating a radio frequency (RF) channel, a distinction key, and numeral keys for designating a program received through the RF channel are successively pressed; if the numeral keys for designating the RF channel, distinction key, and numeral keys for designating the program received through the RF channel are successively pressed, selecting the RF channel corresponding to the numeral keys before the distinction key; arranging digital multichannel television broadcasting programs received through the selected RF channel in the order of their unique numbers; sequentially assigning reference numbers to the arranged programs; and selectively outputting a program to which the reference number corresponding to the numeral keys after the distinction key is assigned.

22 Claims, 5 Drawing Sheets

METHOD AND APPARATUS FOR SELECTING A CHANNEL OF A DIGITAL MULTICHANNEL TELEVISION

BACKGROUND OF THE INVENTION

1. Field of the Invention

The present invention relates to a digital multichannel television (TV), and more particularly, to a method and apparatus for selecting a channel of such a digital multichannel TV.

2. Description of the Related Art

An analog TV broadcasting system such as an NTSC (National Television System Committee) TV can broadcast only one program with respect to a frequency band of one determined RF (Radio Frequency) channel. However, a digital multichannel TV broadcasting system can flexibly assign a bit rate necessary for service which is necessitated, when the bit rate is required. That is, it is possible to transmit a plurality of subchannel programs in a limited transmission bandwidth of one RF channel. For example, SDTV (Standard Definition Television) programs may be simultaneously broadcast for a specific period of time through an RF channel, and an HDTV (High Definition Television) program may be broadcast for another period of time through the same RF channel. As another example, 2-subchannel SDTV programs, one-subchannel voice, one-subchannel data and one-subchannel software may be broadcast through one RF channel, or a one-subchannel SDTV program and a one-subchannel HDTV program may be broadcast through one RF channel. As such an example, there is the U.S. ATSC (Advanced Television System Committee) standard.

In the digital multichannel TV broadcasting system, a plurality of programs can be broadcast through one RF channel, and the programs may vary at any time. It is necessary to display program guide information on a monitor so that a user may select one of the programs. For this, the ATSC standard specifies an electronic program guide (EPG) to enable a user to select a desired program. A broadcasting station sends the EPG information in its RF channel. The digital TV receives and stores the EPG information and displays the EPG information according to a demand of the user. By using the EPG information, the user can confirm the subchannel programs broadcast through one RF channel and select the desired program.

However, in the digital multichannel TV broadcasting, there are a lot of channels since one RF channel may include a plurality of subchannels. Therefore, steps for selecting the channels are complicated and the user may have to press many numeral keys.

SUMMARY OF THE INVENTION

It is therefore an object of the present invention to provide a method for easily selecting a channel in a digital multichannel TV.

Additional objects and advantages of the invention will be set forth in part in the description which follows and, in part, will be obvious from the description, or may be learned by practice of the invention.

The foregoing and other objects are achieved by providing a method of selecting a channel of a digital multichannel television which includes the steps of checking whether numeral keys for designating a radio frequency (RF) channel, a distinction key, and numeral keys for designating the program received through the RF channel are successively pressed; if the numeral keys for designating the RF channel, distinction key, and numeral keys for designating the program received through the RF channel are successively pressed, selecting the RF channel corresponding to the numeral keys before the distinction key; arranging digital multichannel television broadcasting programs received through the selected RF channel in the order of their unique numbers; sequentially assigning reference numbers to the arranged programs; and selectively outputting a program to which the reference number corresponding to the numeral keys after the distinction key is assigned.

BRIEF DESCRIPTION OF THE DRAWINGS

The above and other objects, features and advantages of the present invention will be more apparent from the following detailed description in conjunction with the accompanying drawings of which.

DETAILED DESCRIPTION OF THE PREFERRED EMBODIMENT

In the following description, numerous specific details are set forth to provide a more thorough understanding of the present invention. It will be apparent, however, to one skilled in the art that the present invention may be practiced without these specific details. In other instances, well-known functions or constructions which may obscure the invention in unnecessary detail are not described in detail.

Figure 1:
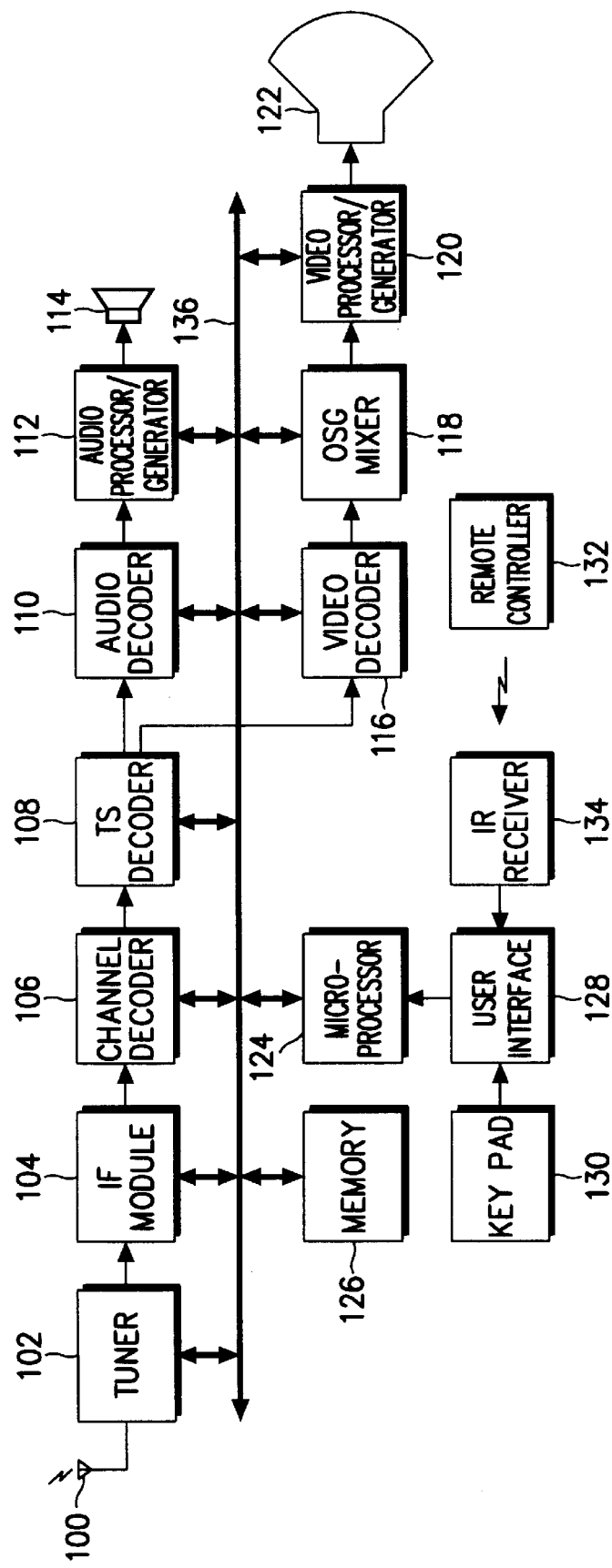
FIG. 1 is a block diagram of an HDTV to which the present invention is applicable.

As one example of the digital multichannel TV, the HDTV adopting the MPEG (Moving Picture Expert Group) standard is illustrated in FIG. 1. A tuner 102 receives a digital multichannel TV broadcasting signal through an antenna 100, selects an RF channel according to the control of a microprocessor 124, and generates an intermediate frequency (IF) signal of the selected RF channel. An IF module 104 converts the IF signal generated from the tuner 102 into a baseband signal. A channel decoder 106 decodes the baseband signal generated from the IF module 104 to reproduce a data bit stream. A transport stream (TS) decoder 108 separates the reproduced data bit stream into audio data, video data and additional data. If a plurality of subchannel programs are received through a currently selected RF channel, the TS decoder 108 selects one of the programs according to the control of the microprocessor 124 and extracts the audio and video data of the selected program.

An audio decoder 110 decodes the audio data sent from the TS decoder 108 according to the MPEG or Dolby AC-3 standard. An audio processor/generator 112 processes the decoded audio data. The processed audio data is sent as a sound through a speaker 114. A video decoder 116 decodes the video data sent from the TS decoder 108 according to the MPEG standard. An OSG (On-Screen Graphic) mixer 118 mixes the decoded video data with OSG data according to the control of the microprocessor 124. A video processor/ generator 120 processes the mixed video data. The processed video data is displayed on a screen through an image receiving tube 122. The OSG data is for displaying various information on the screen by a graphic or text mode.

The microprocessor 124, which is a controller of the HDTV, is connected through a user interface 128 to a key pad 130 and to an infrared (IR) receiver 134. The microprocessor 124 executes a command supplied from the keypad 130 or from a remote controller 132 through the IR receiver 134 according to a program stored in a memory 126. The command supplied from the remote controller 132 is transmitted to the IR receiver 134 as an IR signal and then supplied to the microprocessor 124 through the user interface 128. Moreover, the additional data sent from the TS decoder 108 is supplied to the microprocessor 124. The additional data includes the EPG information and/or PSI (Program Specific Information) which are tables for program related information specified in the MPEG standard.

The memory 126 includes a read only memory (ROM) or a flash memory for storing a code of the microprocessor 124, a random access memory (RAM) for temporarily storing data generated in the process of executing the program of the microprocessor 124, an electrically erasable and programmable read only memory (EEPROM) for storing various reference data, and the like.

The tuner 102, IF module 104, channel decoder 106, TS decoder 108, audio decoder 110, audio processor/generator 112, video decoder 116, OSG mixer 118, video processor/generator 120, and memory 126 are connected to the microprocessor 124 through a bus 136.

Figure 2:
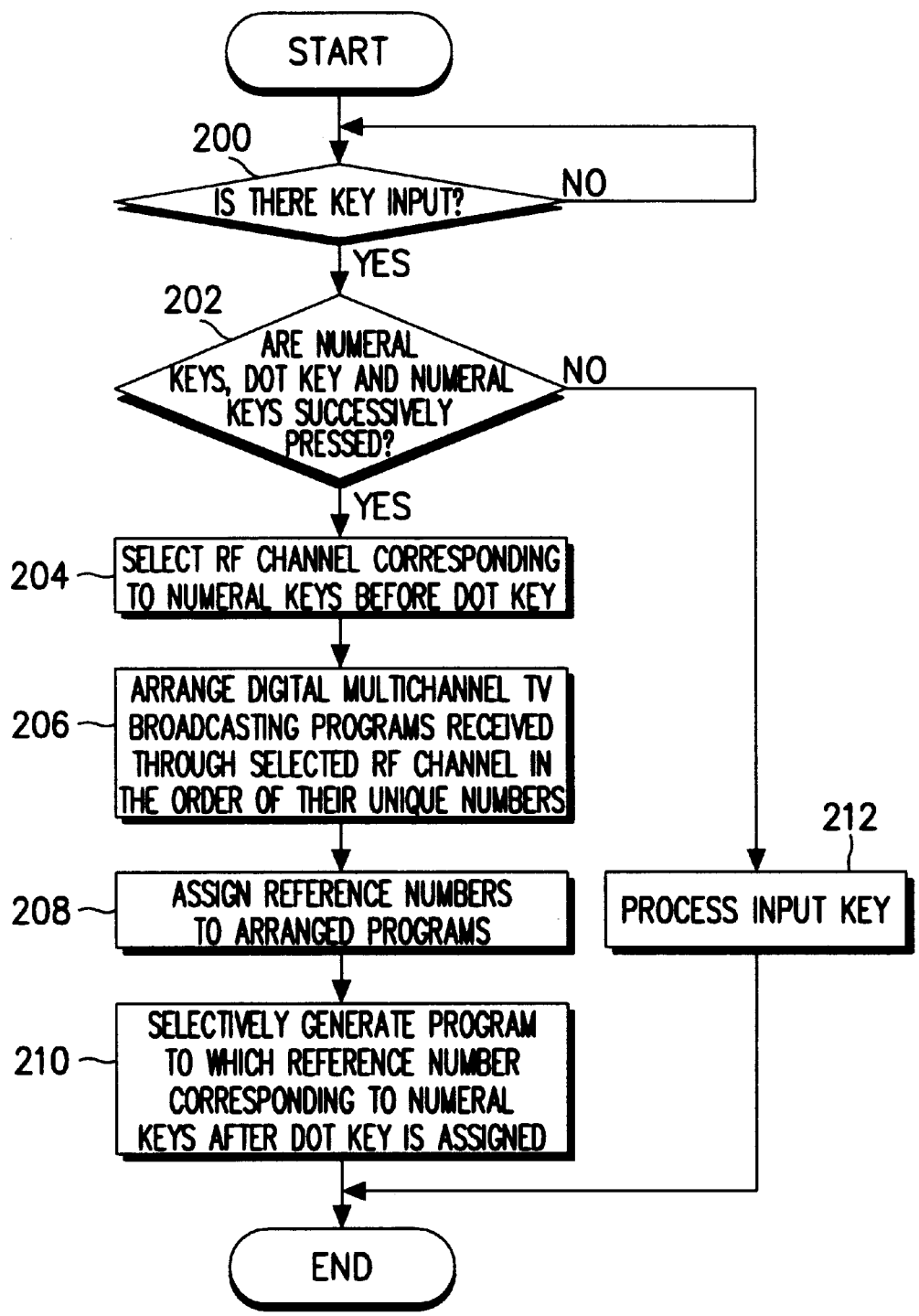
FIG. 2 is a flow chart showing a channel selecting process according to a first embodiment of the present invention.

Referring to FIG. 2, there is illustrated a channel selecting process when the user successively presses numeral keys for designating an RF channel number, a distinction key, and numeral keys for designating a program received through a corresponding RF channel. The function of the flow chart of FIG. 2 is programmed in a nonvolatile memory such as the ROM of the memory 126 so as to be executed by the microprocessor 124.

Figure 5:
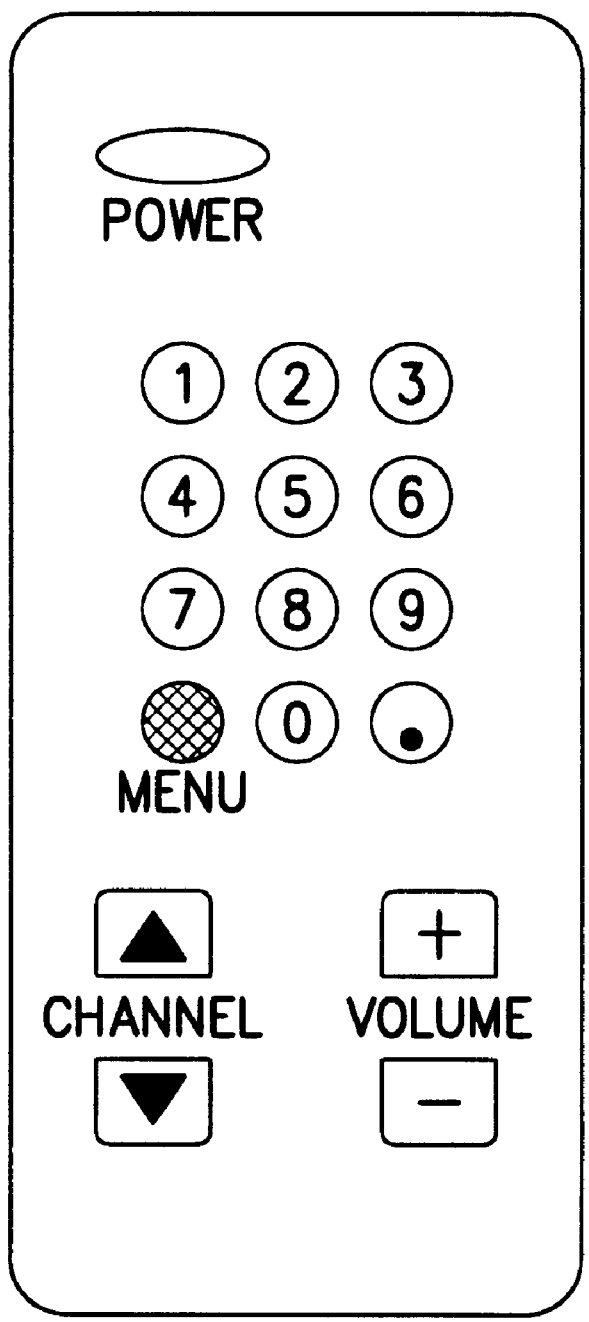
FIG. 5 is a diagram showing a face of a keypad or a remote controller according to the first through third embodiments of the present invention.

FIG. 5 shows a face of a keypad or a remote controller with numeral keys and a distinction key.

The operation according to a first embodiment of the present invention will now be described with reference to FIGS. 1, 2 and 5. The user successively presses the numeral keys, the distinction key and the numeral keys. The numeral keys before the distinction key indicate the RF channel. Since the RF channel is one or more digits, the number of the pressed numeral keys is one or more. The distinction key is pressed to discriminate between the numeral keys for designating the RF channel and for designating the program. Hereinafter, it is assumed that the distinction key uses a dot key, that is, "•" on the key pad 130 or the remote controller 132. The numeral keys after the distinction key indicate a reference number for designating one of the programs received through the RF channel. The reference number has one or more digits.

The microprocessor 124 checks whether there is a key input at step 200. If so, the microprocessor 124 checks, at step 202, whether the numeral keys, the dot key and the numeral keys are successively pressed. If not, input keys are processed at step 212. If the numeral keys, the dot key and the numeral keys are successively pressed, the RF channel corresponding to the numeral keys before the dot key is selected by the tuner 102 in step 204. The tuner 102 generates the IF signal of the selected channel. The IF signal is converted into the baseband signal by the IF module 104 and decoded by the channel decoder 106. The data bit stream is reproduced from the channel decoder 106 and applied to the TS decoder 108. The TS decoder 108 supplies the additional data including the PSI and/or the EPG information to the microprocessor 124.

At step 206, the microprocessor 124 confirms unique numbers for the digital multichannel TV broadcasting programs received through the selected RF channel from the PSI or EPG information and arranges the programs in the order of their unique numbers. At step 208, reference numbers beginning from "0" are sequentially assigned to the arranged programs. For example, if 4 subchannel programs are received through the selected RF channel and if the unique numbers of the 4 programs are "11," "23," "56" and "100," the reference numbers "0," "1," "2" and "3" are assigned to the programs unique numbers "11," "23," "56" and "100," respectively. According to the ATSC standard, a maximum of 999 subchannel programs are received through one RF channel. Practically, 6 or less programs may be received through one RF channel.

At step 210, the program to which the reference number corresponding to the numeral keys after the dot key is assigned is selectively output by the TS decoder 108.

For example, if 4 subchannel programs are received through the RF channel of a number "31" and if the unique numbers of the 4 programs are "11," "23," "56" and "100," the user can select the program of the number "23" received through the RF channel of the number "31" if only he presses "31•1" by use of the key pad 130 or the remote controller 132. Then, the RF channel of the number "31" is selected by the tuner 102 and the program of the number "23" to which the reference number "1" is assigned is selected by the TS decoder 108 so that the user can view the program of the number "23" received through the RF channel of the number "31." Therefore, the user can easily select a desired channel by a successive key input.

If the present invention is applied to the HDTV, the reference number "0" is assigned to the HDTV program number when the selected RF channel has the HDTV program. The reference numbers beginning from "1" are sequentially assigned to the program unique numbers except the HDTV program. In such a case, if the present invention is applied to the TV for receiving the digital multichannel TV broadcasting of the ATSC standard, the largest reference number will be "999."

Figure 3:
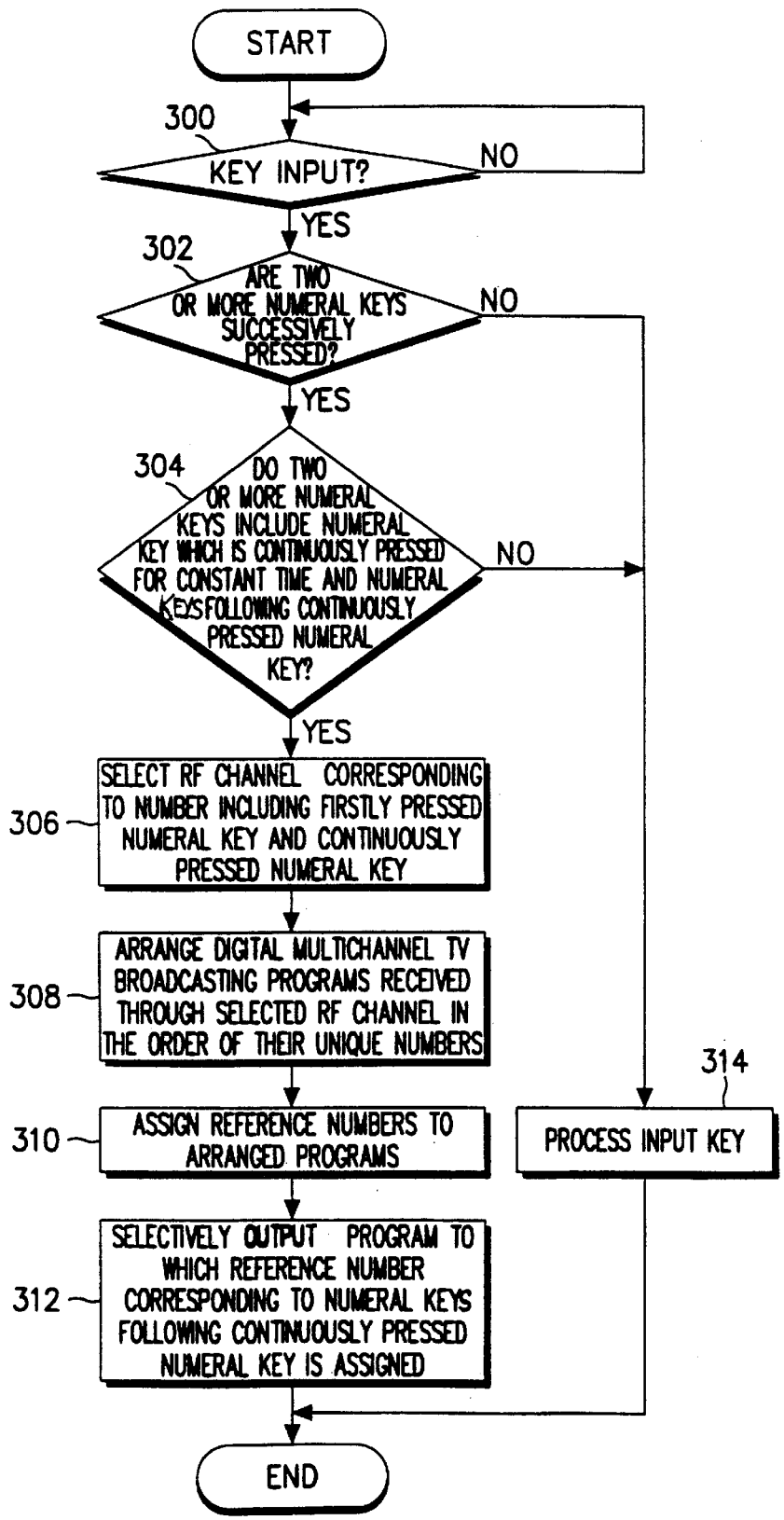
FIG. 3 is a flow chart showing a channel selecting process according to a second embodiment of the present invention.

Referring to FIG. 3, there is shown a channel selecting process by a successive key input without pressing a distinct distinction key. That is, the user presses the numeral keys corresponding to the RF channel, but then continuously presses the last numeral key for a constant time, for example, for one or two seconds. Thereafter, the user presses the numeral keys for designating one of the programs. The continuously pressed key for a constant time serves as the distinction key. Since the RF channel has one or more digits as described above, the number of the successively pressed numeral keys including the numeral key for the reference number are two or more. The function of the flow chart of FIG. 3 is programmed in the nonvolatile memory such as the ROM of the memory 126 so as to be executed by the microprocessor 124.

The operation according to a second embodiment of the present invention will be described hereinafter with reference to FIGS. 1 and 3. The microprocessor 124 checks whether there is a key input at step 300. If so, the microprocessor 124 checks, at step 302, whether two or more numeral keys are successively pressed. If so, the microprocessor 124 checks, at step 304, whether the two or more numeral keys include a numeral key which is continuously pressed for a constant time and numeral keys following the continuously pressed numeral key. If two or more numeral keys are not pressed at step 302 or the pressed numeral keys do not include the numeral key which is continuously pressed and the numeral keys following the continuously pressed numeral key, input keys are processed at step 314.

If the pressed numeral keys include the numeral key which is continuously pressed for a constant time and the numeral keys following the continuously pressed numeral key, the RF channel corresponding to the number including the firstly pressed numeral key and the continuously pressed numeral key is selected by the tuner 102 in step 306. In steps 308 and 310, which are identical to the steps 206 and 208 of FIG. 2, the digital TV broadcasting programs received through the selected RF channel are arranged in the order of their unique numbers (step 308) and the reference numbers are sequentially assigned thereto (step 310). At step 312, the program to which the reference number corresponding to the numeral keys following the continuously pressed numeral key is selectively output by the TS decoder 108.

For example, if 4 subchannel programs are received through the RF channel of the number "31" and if the unique numbers of the 4 programs are "11," "23," "56" and "100," respectively, the user can view the program of the number "23" received through the RF channel of the number "31" by successively pressing "3," "1" and "1," especially by continuously pressing the middle numeral key "1" for a constant period of time. Then the RF channel of the number "31" is selected by the tuner 102 and the program of the unique number "23" to which the reference number "1" is assigned is selected by the TS decoder 108. Therefore, the user can view the program of the number "23" received through the RF channel of the number "31."

Thus, the user can easily select a desired channel by a successive key input. Namely, even if the key pad 130 or the remote controller 132 does not include any separate key to be used as the distinction key such as the dot key, the desired channel is easily selected.

Figure 4:
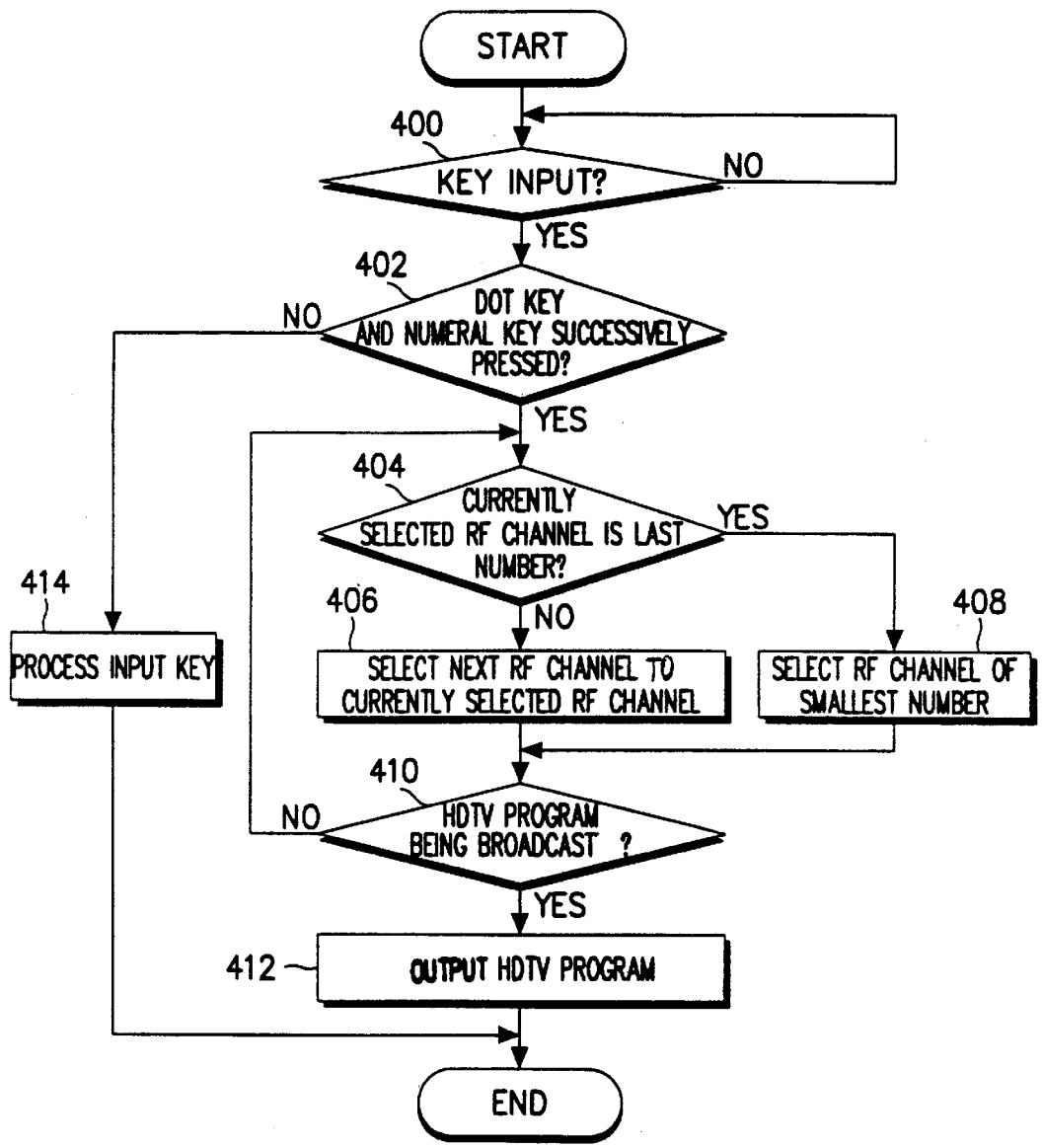
FIG. 4 is a flow chart showing a channel selecting process according to a third embodiment of the present invention.

Referring to FIG. 4, there is illustrated a channel selecting process when the user views only the HDTV program. That is, if it is desired to view only the HDTV program, the user successively presses the distinction key and a specific numeral key. The distinction key is set to the dot key as noted above and the specific numeral key is set to "0." The function of the flow chart of FIG. 4 is programmed in the ROM of the memory 126 so as to be executed by the microprocessor 124.

The operation according to a third embodiment of the present invention will now be described with reference to FIGS. 1 and 4. The microprocessor 124 checks whether there is a key input at step 400. If so, the microprocessor 124 checks, at step 402, whether the dot key and the numeral key are successively pressed. If not, input keys are processed at step 414. If the dot key and the numeral key are successively pressed in step 402, the microprocessor 124 checks whether the currently selected RF channel is the last number (of possible RF channels) at step 404. If not, the next RF channel to the currently selected RF channel is selected by the tuner 102 at step 406. It is also possible to select the current RF channel by the tuner 102 at step 406. If the currently selected RF channel is the last number, the RF channel of the smallest number (of possible RF channels) is selected by the tuner 102 at step 408. The microprocessor 124 checks, at step 410, whether the HDTV program is being broadcast through the selected RF channel by the PSI or EPG information generated from the TS decoder 108. If the HDTV program is being broadcast, the HDTV program is output by the TS decoder 108 at step 412. If the HDTV program is not being broadcast, the microprocessor 214 returns to step 404.

Therefore, if the user presses "•0," the next RF channel to the currently selected RF channel is selected for a search of the HDTV program. That is, since the HDTV program can be confirmed whenever the user presses "•0," the desired HDTV program can be easily selected.

As mentioned previously, the user can easily select the desired channel in the digital multichannel TV.

While the present invention has been shown and described with reference to preferred embodiments thereof, it will be understood by those skilled in the art that the present invention should not be limited to the specific embodiments illustrated above. For example, although the present invention has been applied to the HDTV, it may be applicable to all apparatuses for receiving the digital multichannel TV broadcasting. Therefore, the present invention should be understood as including all possible embodiments and modifications which do not depart from the spirit and scope of the present invention set forth in the appended claims.

What is claimed:

1. A method of selecting a program of a digital multichannel television, comprising the steps of:

checking whether at least one numeral key for designating a radio frequency channel, a distinction key, and at least one numeral key for designating said program received through said radio frequency channel are successively pressed;

if said at least one numeral key for designating a radio frequency channel, distinction key, and at least one numeral key for designating said program are successively pressed, selecting said radio frequency channel corresponding to said at least one numeral key pressed before said distinction key;

arranging digital multichannel television broadcasting programs received through the designated radio frequency channel in an order of corresponding unique numbers of said digital multichannel television broadcasting programs;

sequentially assigning reference numbers to the arranged programs; and selectively outputting said program to which the reference number corresponding to said at least one numeral key pressed after said distinction key is assigned.

2. The method as claimed in claim 1, wherein said at least one numeral key pressed before said distinction key is one or two digits, and said at least one numeral key pressed after said distinction key is at least one digit.

3. The method as claimed in claim 2, wherein said reference numbers begin from a number "0."

4. The method as claimed in claim 2, wherein the reference numbers beginning from "1" are assigned to said digital multichannel television broadcasting programs except for a high definition television program, and if said high definition TV program is present in said designated RF channel, the reference number of "0" is assigned to said high definition television program.

5. The method as claimed in claim 1, wherein said distinction key is a dot key on a key pad or a remote controller of said digital multichannel television.

6. A method of selecting a program of a digital multichannel television, comprising the steps of:

checking whether at least two numeral keys are successively pressed and a numeral key just before at least one last numeral key is continuously pressed for a predetermined amount of time;

if said at least two numeral keys are successively pressed and if said numeral key just before said at least one last numeral key is continuously pressed for the predetermined amount of time, selecting a radio frequency channel corresponding to a number from a first pressed numeral key to the continuously pressed numeral key;

arranging digital multichannel television broadcasting programs received through the selected radio frequency channel in an order of corresponding unique numbers of said digital multichannel television broadcasting programs;

sequentially assigning reference numbers to the arranged programs; and selectively outputting said program to which the reference number corresponding to said at least one last numeral key after said continuously pressed numeral key is assigned.

7. The method as claimed in claim 6, wherein the number of numeral keys from the firstly pressed numeral key to the continuously pressed numeral key is one or two.

8. A method for selecting a program of a digital multichannel television, comprising the steps of:

checking whether a distinction key and a numeral key are successively pressed;

if said distinction key and said numeral key are successively pressed, checking whether a currently selected radio frequency channel is a last number of radio frequency channels;

if said current selected radio frequency channel is not the last number, selecting a next radio frequency channel of said currently selected radio frequency channel;

confirming whether a high definition television program is being received through the selected radio frequency channel;

if said high definition television program is being received through the selected radio frequency channel, outputting said high definition television program; and if said high definition television program is not being received by the selected radio frequency channel, returning to said step of checking whether a current radio frequency channel is a last number of radio frequency channels.

9. The method as claimed in claim 8, further comprising the step of selecting the radio frequency channel of a smallest number of said radio frequency channels and returning to said confirming step, if the currently selected radio frequency channel is the last number.

10. The method as claimed in claim 9, wherein said distinction key and said numeral key are a dot key and "0," respectively, on a key pad or a remote controller of said digital multichannel television.

11. A method of selecting a program of a digital multichannel television, wherein each of a plurality of channels includes at least one program, the method comprising the steps of:

selecting the program by detecting activation of a distinction key followed by activation of at least one numeral key; and displaying the selected program.

12. The method as claimed in claim 11, wherein said selecting step comprises the steps of:

detecting activation of at least one numeral key prior to the activation of the distinction key;

selecting one of the channels based upon the activation of the at least one numeral key prior to the activation of the distinction key; and selecting the program of the selected channel based upon the activation of the at least one numeral key following the distinction key;

wherein the distinction key is not a numeral key.

13. The method as claimed in claim 11, wherein said selecting step comprises the steps of:

detecting activation of at least one numeral key prior to the activation of the distinction key;

selecting one of the channels based upon the activation of the at least one numeral key prior to the activation of the distinction key; and arranging the programs of the selected channel in an order of corresponding distinct numbers;

sequentially assigning reference numbers to the arranged programs; and selecting the program of the selected channel based upon the activation of the at least one numeral following the distinction key which corresponds to one of the reference numbers of the arranged programs;

wherein the distinction key is not a numeral key.

14. The method as claimed in claim 11, wherein said selecting step comprises the steps of:

detecting activation of a plurality of numeral keys, including activation of at least one numeral key prior to activation of one of the numeral keys for at least a predetermined period of time, the activation of the one of the numeral keys for at least the predetermined period of time, wherein the one of the numeral keys activated for at least the predetermined period of time functions as the distinction key, and the activation of the at least one numeral key following the distinction key;

selecting one of the channels based upon the activation of the at least one numeral key prior to and including the activation of the distinction key; and selecting the program of the selected channel based upon the activation of the at least one numeral key following the distinction key.

15. The method as claimed in claim 11, wherein said selecting step comprises the steps of:

detecting activation of a plurality of numeral keys, including activation of at least one numeral key prior to activation of one of the numeral keys for at least a predetermined period of time, the activation of the one of the numeral keys for at least the predetermined period of time, wherein the one of the numeral keys activated for at least the predetermined period of time functions as the distinction key, and the activation of the at least one numeral key following the distinction key;

selecting one of the channels based upon the activation of the at least one numeral key prior to and including the activation of the distinction key;

arranging the programs of the selected channel in an order of corresponding distinct numbers;

sequentially assigning reference numbers to the arranged programs; and selecting the program of the selected channel based upon the activation of the at least one numeral following the distinction key which corresponds to one of the reference numbers of the arranged programs.

16. The method as claimed in claim 11, wherein said selecting step comprises the steps of:
   detecting activation of the distinction key and the at least one numeral key following the activation of the distinction key;
   searching for a high definition television program starting with a currently selected channel and then searching subsequent ones of the channels; and
   selecting the high definition television program as the selected program upon finding the high definition television program in said searching step;
   wherein the distinction key is not a numeral key.

17. The method as claimed in claim 16, wherein said searching step comprises the steps of:
   determining whether the currently selected channel is a last of the channels;
   selecting a next channel to the currently selected channel if the currently selected channel is not the last channel, to determine a current search channel;
   selecting a first one of the channels if the currently selected channel is the last channel, to determine the current search channel; and
   determining whether the current search channel includes the high definition television program.

18. The method as claimed in claim 16, wherein said searching step comprises the steps of:
   determining whether the currently selected channel is a last of the channels;
   selecting the currently selected channel if the currently selected channel is not the last channel, to determine a current search channel;
   selecting a first one of the channels if the currently selected channel is the last channel, to determine the current search channel; and
   determining whether the current search channel includes the high definition television program.

19. A television (TV) receiver to select a program of a digital multichannel television, wherein each of a plurality of channels includes at least one program, comprising:
   a tuner to select one of the plurality of channels based upon a channel select command, and in response, generates an intermediate frequency signal;
   an IF modulate to convert the intermediate frequency signal to a baseband signal;
   a channel decoder to decode the baseband signal, to output a channel signal having a data bit stream;
   a transport stream decoder to separate the data bit stream into video data of the selected program based upon a program select command, and auxiliary data including a list of programs of the selected channel;
   an input device having numeral keys and a distinction key; and
   a processor to detect activation of the distinction key, to generate the channel select command based upon activation of any of the numeral keys prior to the activation of the distinction key, and to generate the program select command based upon activation of any of the numeral keys subsequent to the activation of the distinction key.

20. The TV receiver as claimed in claim 19, wherein said processor detects the activation of at least one numeral key prior to the activation of the distinction key, to generate the channel select command based upon the activation of at least one numeral key prior to activation of the distinction key, and to generate the program select command based upon activation of at least one numeral key following the distinction key, the distinction key not being a numeral key.

21. The TV receiver as claimed in claim 19, wherein said processor detects activation of a plurality of numeral keys, including activation of at least one numeral key prior to activation of one of the numeral keys for at least a predetermined period of time, the activation of the one of the numeral keys for at least the predetermined period of time, wherein the one of the numeral keys activated for at least the predetermined period of time functions as the distinction key, and the activation of the at least one numeral key following the distinction key, said processor generates the channel select command based upon the activation of the at least one numeral key prior to and including the activation of the distinction key, and generates the program select command based upon the activation of the at least one numeral key following the distinction key.

22. A television (TV) receiver to select a program of a digital multichannel television, wherein each of a plurality of channels includes at least one program, comprising:
   a tuner to select one of the plurality of channels, and in response, generates an intermediate frequency signal;
   an IF modulate to convert the intermediate frequency signal to a baseband signal;
   a channel decoder to decode the baseband signal, to output a channel signal having a data bit stream; and
   a transport stream decoder to separate the data bit stream into video data of the selected program based upon a program select command, and auxiliary data including a list of programs of the selected channel;
   an input device having numeral keys and a distinction key; and
   a processor to detect activation of the distinction key and at least one numeral key following the activation of the distinction key, to search for a high definition television program starting with a currently selected channel and then search subsequent ones of the channels for the high definition television channel, and select the high definition television program as the selected program upon finding the high definition television program;
   wherein the distinction key is not a numeral key.

* * * * *